(12) United States Patent
Sun

(10) Patent No.: US 11,769,779 B2
(45) Date of Patent: Sep. 26, 2023

(54) METHOD FOR PASSIVATING FULL FRONT-SIDE DEEP TRENCH ISOLATION STRUCTURE

(71) Applicant: OMNIVISION TECHNOLOGIES, INC., Santa Clara, CA (US)

(72) Inventor: Shiyu Sun, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 596 days.

(21) Appl. No.: 16/725,687

(22) Filed: Dec. 23, 2019

(65) Prior Publication Data

US 2021/0193704 A1 Jun. 24, 2021

(51) Int. Cl.
*H01L 27/146* (2006.01)
*H01L 21/285* (2006.01)
*H01L 21/02* (2006.01)
*H01L 21/762* (2006.01)

(52) U.S. Cl.
CPC .... *H01L 27/1463* (2013.01); *H01L 21/02129* (2013.01); *H01L 21/02271* (2013.01); *H01L 21/28525* (2013.01); *H01L 21/76224* (2013.01); *H01L 21/76237* (2013.01); *H01L 27/1464* (2013.01); *H01L 27/1469* (2013.01); *H01L 27/14612* (2013.01); *H01L 27/14627* (2013.01); *H01L 27/14634* (2013.01); *H01L 27/14636* (2013.01); *H01L 27/14685* (2013.01); *H01L 27/14689* (2013.01); *H01L 27/14698* (2013.01)

(58) Field of Classification Search
CPC ....... H01L 21/76224–76237; H01L 21/02129; H01L 21/225–2251; H01L 21/2255–2256; H01L 27/1463; H01L 27/1464; H01L 27/146–14893
See application file for complete search history.

(56) References Cited

U.S. PATENT DOCUMENTS

| | | | |
|---|---|---|---|
| 5,504,018 A * | 4/1996 | Sato .................. | H01L 29/66242 148/DIG. 124 |
| 8,853,811 B2 | 10/2014 | Lai et al. | |
| 10,177,187 B2 | 1/2019 | Kalnitsky | |
| 2007/0054464 A1* | 3/2007 | Zhang ................. | H01L 29/7835 257/E21.628 |
| 2007/0262475 A1* | 11/2007 | Cheng .................. | G03F 9/7076 257/797 |
| 2013/0113061 A1* | 5/2013 | Lai .......................... | H01L 31/09 257/E31.127 |

(Continued)

*Primary Examiner* — Kevin Parendo
(74) *Attorney, Agent, or Firm* — Christensen O'Connor Johnson Kindness PLLC

(57) ABSTRACT

A method for forming a deep trench isolation structure for a CMOS image sensor includes providing a trench that extends from a first side toward a second side of a semiconductor substrate. The trench has an opening on the first side and a bottom and sides. A conformal layer of B-doped oxide is deposited on the bottom and sides of the trench and is less than half a width of the trench leaving a depthwise recess in the trench. A second material is deposited on the conformal layer of B-doped oxide in the trench filling the recess in the trench to the first side. The conformal layer of B-doped oxide is annealed driving boron from the conformal layer of B-doped oxide to the semiconductor substrate forming a B-doped region as a passivation layer juxtaposed next to the conformal layer of B-doped oxide having negative fixed charges.

19 Claims, 9 Drawing Sheets

(56) References Cited

U.S. PATENT DOCUMENTS

| | | | | |
|---|---|---|---|---|
| 2014/0145251 A1* | 5/2014 | Favennec | .......... | H01L 21/76224 438/437 |
| 2014/0264504 A1* | 9/2014 | Kao | .................... | H01L 27/1464 257/292 |
| 2015/0041948 A1* | 2/2015 | Pu | ..................... | H01L 21/76235 257/506 |
| 2017/0092684 A1* | 3/2017 | Chang | ................. | H01L 27/1463 |
| 2017/0179278 A1* | 6/2017 | Baldwin | ............ | H01L 21/2253 |

\* cited by examiner

US 11,769,779 B2

METHOD FOR PASSIVATING FULL FRONT-SIDE DEEP TRENCH ISOLATION STRUCTURE

BACKGROUND INFORMATION

Field of the Disclosure

This disclosure relates generally to image sensors, and in particular but not exclusively, relates to isolation structures in image sensors.

Background

CMOS image sensors (CIS) have become ubiquitous. They are widely used in digital still cameras, cellular phones, security cameras, as well as medical, automobile, and other applications. The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output voltage of each photosensitive element that varies as a function of the incident image light. In other words, the amount of image charge generated is proportional to the intensity of the image light, which is utilized to produce a digital image (i.e., image data) representing the external scene.

The technology used to manufacture image sensors has continued to advance at a great pace. The demands of higher resolution and lower power consumption have encouraged the further miniaturization and integration of these devices. As the demand for image sensors continues to be rise, high packing density with isolation as well as low noise performance of the pixel cells in the image sensors have become increasingly challenging.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
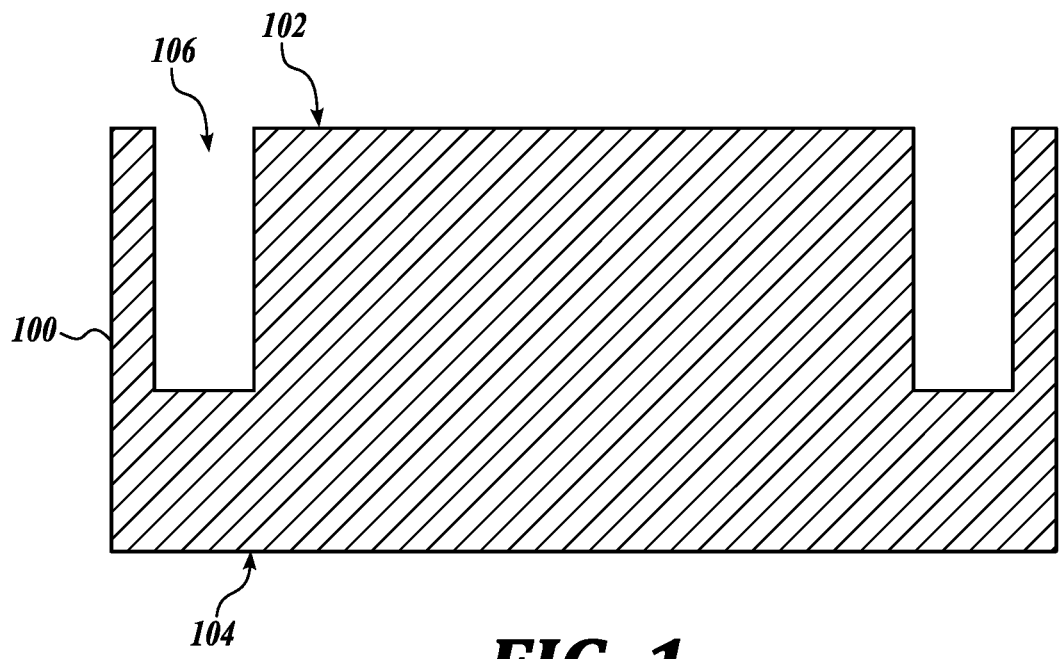
FIGS. 1-7 are cross-sectional illustrations of a semiconductor structure that show an example of a process for passivating full front-side deep trench isolation (DTI) structure for a CMOS image sensor in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Apparatuses and methods directed to passivated full front-side deep trench isolation structures for CMOS image sensors, for example, are disclosed. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example and embodiment. Furthermore, the particular features, structures, or characteristics may be combined in any suitable manner in one or more examples and embodiments.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. Additionally, it will also be understood that when a layer is referred to as being "between" two layers, it can be the only layer between the two layers, or one or more intervening layers may also be present.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

Throughout this specification, several terms of art are used. These terms are to take on their ordinary meaning in the art from which they come, unless specifically defined herein or the context of their use would clearly suggest otherwise. It should be noted that names of chemical elements and their symbols may be used interchangeably throughout this document (e.g., Si vs. silicon); however, both have identical meaning.

Deep trench isolation technology is adopted for use in CMOS image sensors to improve the Modulation Transfer Function (MTF). MTF refers to the degree to which an image sensor can transfer the details of an object into an image, also referred to as the sharpness of the image. In one example, the MTF is improved by reducing cross-talk through the use of deep trench isolation structures.

There are various approaches of fabricating deep trench isolation structures. One approach is to fabricate deep trench isolation structures from the back-side of the semiconductor substrate. Another approach is to fabricate partial deep trench isolation structures that do not extend entirely from the back-side to the front-side of the semiconductor substrate. Both back-side fabricated and partial deep trench isolation structures have advantages to recommend their use in CMOS image sensors.

As will be discussed, an example in accordance with the teachings of the present invention is directed to an image sensor having a front-side fabricated, full deep trench isolation structure with a passivation layer. In various examples, the full front-side deep trench isolation structure for a CMOS image sensor is formed from the front-side of the semiconductor substrate, such as a P-type silicon substrate, and in the finished pixel, the deep trench isolation structure will extend from the front-side surface depthwise into the semiconductor substrate to reach the back-side of the semiconductor substrate providing a "full" deep trench isolation structure.

In various examples, the front-side fabricated, full deep trench isolation structure with passivation layer is advantageous due to employing an etching processes for the trench without concern of precisely ending the etching step. Further, in the processes to make the full front-side fabricated deep trench isolation structures, high temperatures can be employed due to forming the front-side fabricated deep trench isolation structures prior to photodiode formation.

However, notwithstanding the advantages, front-side fabricated trenches should undergo sidewall surface passivation after etching to avoid white pixel and dark current effects. The use of typical high K films having negative fixed charges, such as AlOx and others, for passivation is unsuitable for front-side fabricated trenches, since the negative charges of such high K films will not be retained under the high thermal treatments of downstream processing. The use of gas phase passivation is also unsuitable or insufficient for deep trench passivation due to the high aspect ratio of deep trenches, resulting in insufficient passivation occurring at or near to the bottom of the trench. Furthermore, plasma implantation is nonuniform and can result in damage due to the higher plasma density near the opening of the trench which leads to more doping near to the opening and less doping progressively through the trench.

Accordingly, in one example, a doping method to passivate the sidewalls and bottom of a deep trench isolation structure is provided that enables front-side fabricated, passivated full deep trench isolation structures for CMOS image sensors.

To illustrate an example process, FIG. 1 shows a cross section of a semiconductor substrate 100 with a front-side 102 and a back-side 104. In this disclosure "front-side" may be also be referred to as the first side, and "back-side" may also be referred to as the second side opposite to the first side. In some embodiments, the back-side 104 (second side) may be also refer to an illuminated side and the front-side 102 (first side) may refer to a non-illuminated side. The semiconductor substrate 100 illustrated has been etched by any suitable etching process to form trenches 106 having openings on the first side 102, which extend toward but do not penetrate to the second side 104.

In one example, the trenches 106 are fabricated in a series of steps including creating a photomask, etching, and then cleaning away the photomask. In illustrated embodiments, the trenches 106 is the trench for forming the deep trench isolation structure. In one example, a critical dimension (trench width) of trench 106 can be about 100 nm to about 150 nm. The trench 106 is an opening whose bottom and sides are formed in the semiconductor substrate 100.

In FIG. 1, the trenches 106 are illustrated as not completely extending from the first side 102 to the second side 104. The etching may be performed so that the trench 106 depth is greater than or equal to the final thickness (or depth) of the semiconductor substrate 100. In one example, the depth of the trench is about 3 μm. As described further herein, the second side 104 of the semiconductor substrate 100 will be subjected to material removal to thin the semiconductor substrate 100 to result in the final thickness or depth of the semiconductor substrate 100 to be less than the depth of the trench 106 after the full front-side deep trench isolation structure is fabricated.

In one example, the full front-side deep trench isolation structure is fabricated from a series of trenches, for example trench 106. Specifically, in one example, the full front-side deep trench isolation structure is fabricated by forming a plurality of trenches (e.g., trench 106) aligned in a first direction intersecting with a plurality of trenches (e.g., trench 106) aligned in a second direction, where the first direction is perpendicular to the second direction. In this manner, the full front-side deep trench isolation structure forms a grid of squares, for example, in which a photodiode can be fabricated within a square to electrically isolate the photodiode from adjacent photodiodes. (See also FIGS. 8 and 9A.) However, it should be appreciated that in other embodiments, the full front-side deep trench isolation structure may form a grid of other geometric shape, such as triangular, pentagon-shape defining the photodiode region.

Figure 2:
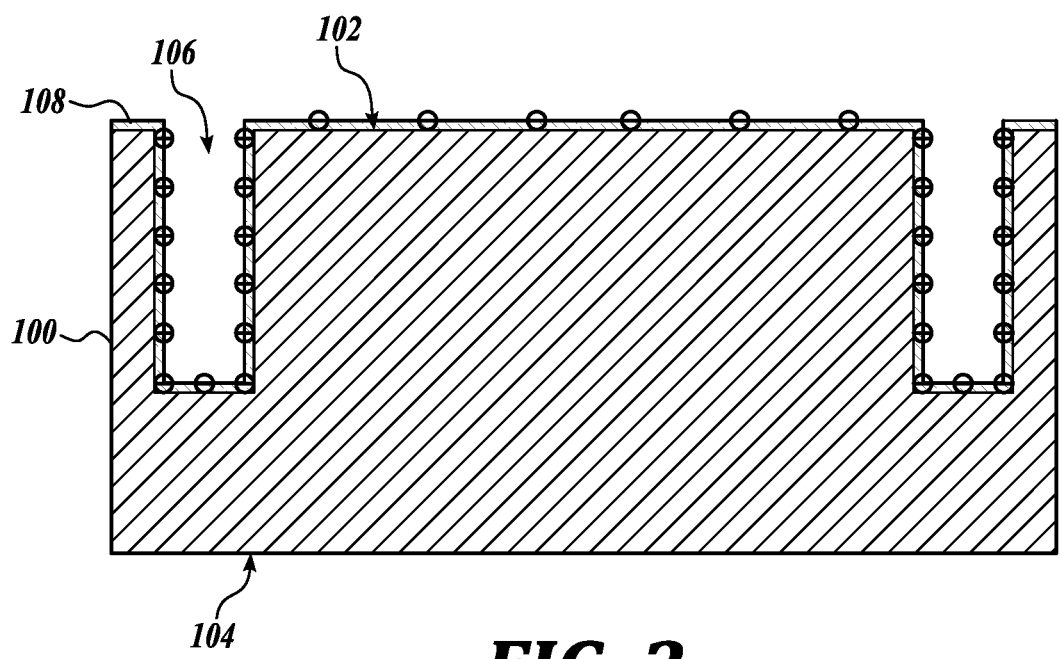

In one example, after etching and cleaning the trenches 106, a conformal layer of boron (B)-doped oxide 108 is deposited at least on the bottom and sides of the trench 106, wherein the thickness of the conformal layer of B-doped oxide 108 is less than half a width of the trench 106 to leave a depthwise recess in the trench 106. In one example, the conformal layer of B-doped oxide 108 is deposited on the first side 102 of the semiconductor substrate 100 while also being deposited on the bottom and sides of the trench 106. In one example, the conformal layer of B-doped oxide is about 3 nm to 30 nm thick. In one example, the conformal layer of B-doped oxide 108 is formed by chemical vapor deposition (CVD) or atomic layer deposition (ALD). In one example, the conformal layer of B-doped oxide 108 is conformal around the trench 106 at the top, sides, and bottom, which is achieved by the use of chemical vapor deposition or atomic layer deposition. The result of depositing the conformal layer of B-doped oxide 108 is shown in the example depicted in FIG. 2.

In one example, the conformal layer of B-doped oxide 108 is formed by chemical vapor deposition at a deposition temperature of about 300° C. to about 500° C. and a deposition pressure about 1 to 760 Torr.

In one example, the boron doping in the conformal layer of B-doped oxide 108 is in situ doping where boron dopants are introduced to the oxide film during the oxide deposition process. In one example, the boron atomic concentration of the conformal layer of B-doped oxide 108 is about 5% to 20% when deposited, but the boron atomic concentration will decrease after application of thermal annealing that drives the boron from the conformal layer of B-doped oxide 108 into the nearby region within the semiconductor substrate 100.

In one example, the conformal layer of B-doped oxide 108 will remain in the trench 106 through the process. The conformal layer of B-doped oxide 108 has at least a negative fixed charge that will help to passivate the trench 106 surface. It is theorized that a negative fixed charge is a property of the B-doped oxides that is related to the boron-silicon-oxygen network, and the negative fixed charge remains after thermal annealing. The amount of negative fixed charges contained in the conformal layer of B-doped oxide 108 may be related to the thickness of the conformal layer of B-doped oxide 108. For example, the thicker the conformal layer of B-doped oxide 108, the higher the amount of the negative fixed charges contained in the conformal layer of B-doped oxide 108.

In one example, the conformal layer of B-doped oxide 108 is a borosilicate glass (BSG). Borosilicate glass includes any borosilicate glass which includes at least silica (silicon dioxide, $SiO_2$) and boric oxide ($B_2O_3$). In one example, the amount of boric oxide can be varied to give the borosilicate glass different properties. In one example, the borosilicate glass can contain alkaline earths and alumina ($Al_2O_3$). In one example, borosilicate glass containing up to 13% by weight boric oxide and silica over 80% by weight can have high chemical resistance and low thermal expansion. A higher boric oxide content generally produces softer glasses.

In one example, deposition of a borosilicate glass is by Atmospheric Pressure Chemical Vapor Deposition (APCVD) using $SiH_4$, $O_2$, $B_2H_6$ gases at a deposition temperature of about 430° C. The borosilicate glass layer thickness and boron concentration can be controlled by the gas flow ratio of $B_2H_6$ to $SiH_4$, respectively.

In one example, the conformal layer of B-doped oxide 108 is a B-doped dielectric, such as boron doped zinc oxide ZnO:B, etc.

Figure 3:
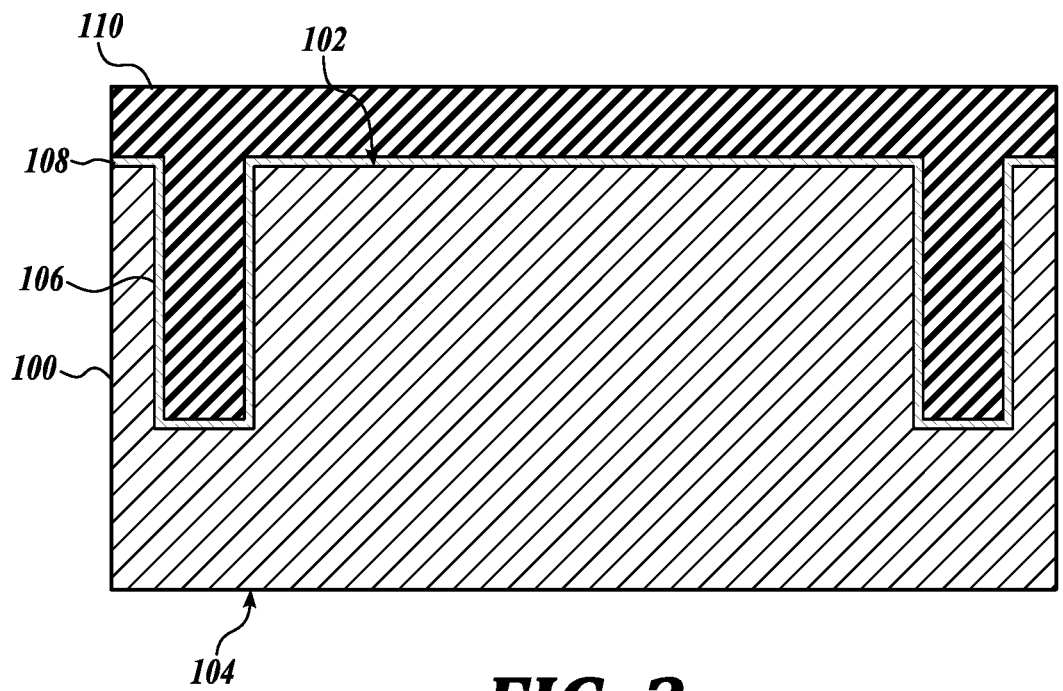

After the deposition of the conformal layer of B-doped oxide (first material), a second material 110 is deposited at least on the conformal layer of B-doped oxide 108 in the trench 106, wherein the second material 110 completely fills the recess remaining in the trench 106 after the deposition of the conformal layer of B-doped oxide 108. In one example, the second material 110 is also deposited over the conformal layer of B-doped oxide 108 on the first side 102 of the semiconductor substrate 100 as illustrated in the example depicted in FIG. 3. In either case, the second material 110 completely fills the trench 106 at least to the level of the first side 102. For example, the second material 110 may fill the trench 106 to a surface of the first side 102 such that the first side 102 surface is leveled for subsequent photolithography process for ion implantation and gate formation process.

In one example, the second material 110 is a dielectric. Dielectrics include, but are not limited to, silicon oxide ($SiO_2$), hafnium oxide ($HfO_2$), silicon nitride ($Si_3N_4$), silicon oxynitride ($SiO_xN_y$), tantalum oxide ($Ta_2O_5$), titanium oxide ($TiO_2$), zirconium oxide ($ZrO_2$), aluminum oxide ($Al_2O_3$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), erbium oxide ($Er_2O_3$), thulium oxide ($Tm_2O_3$), ytterbium oxide ($Yb_2O_3$), lutetium oxide ($Lu_2O_3$), yttrium oxide ($Y_2O_3$), or other suitable dielectric material. In one example, the second material 110 can be the borosilicate glasses or the boron doped zinc oxide ZnO:B described above.

In one example, the second material 110 is a doped polysilicon. In one example, the doped polysilicon is deposited by chemical vapor deposition (CVD) at a deposition temperature of about 500° C. In one example, depositing the second material includes depositing doped polysilicon by chemical vapor deposition at a deposition temperature between 450° C. to 550° C. In one example, the doped polysilicon can be either an n-type doped (e.g., phosphorus) polysilicon or a p-type doped (e.g., boron) polysilicon. In one example, the doping process is an in-situ doping process wherein dopants are introduced to the polysilicon during the deposition process.

After deposition of the second material 110, if necessary, chemical mechanical polishing is performed to remove the excessive doped polysilicon 110 together with the conformal layer of B-doped oxide 108 on top of the trench 106. The chemical mechanical polishing stops on the first side 102 of the semiconductor substrate 100 as illustrated in the example depicted in FIG. 4.

In one example, the doped polysilicon is preferred for the second material 110 because doped polysilicon is a conductor through which biasing can be applied. In one embodiment, the doped polysilicon may be negative biased to form additional hole accumulation layer surround the trench 106 passivating trench sidewalls and bottom surface to reduce dark current. However, biasing is not mandatory in the second material 110.

Figure 5:
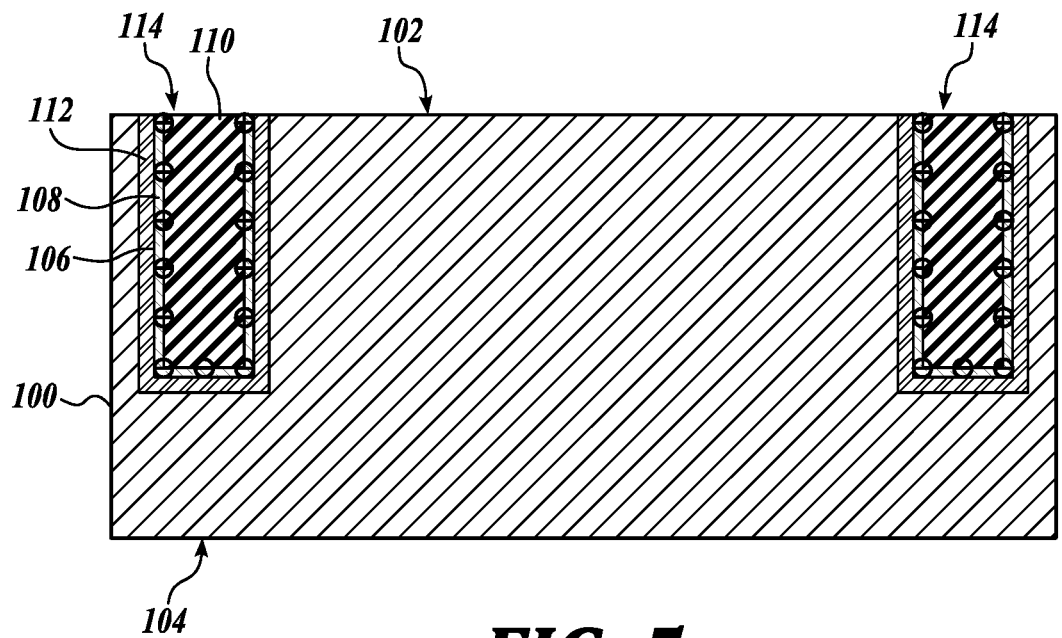

In one example, after deposition of the second material 110, thermal annealing is applied to drive boron from the conformal layer of B-doped oxide 108 into the silicon semiconductor substrate 100, for example by a diffusion process, to form a boron doped silicon region 112 as a passivation layer surrounding the trench 106 on the sides and bottom, as illustrated in the example depicted in FIG. 5 preventing defects/trap sites on sidewalls and bottom from trapping electrons and generating dark current. The structure of FIG. 5 is considered a completed front-side fabricated, deep trench isolation structure 114 with passivation layer. After removal of material from the second side 104 of the semiconductor substrate 100, the front-side deep trench isolation structure 114 will be considered to be "full" meaning that structure 114 extends from the first side 102 to the second side 104 of the semiconductor substrate 100.

In one example, in the annealing step, the annealing temperature for annealing the conformal layer of B-doped oxide 108 is about 800° C. to about 1000° C., and the time at the annealing temperature can be about 1 min to about 60 min. The time would be inversely proportional to the annealing temperature, so that lower annealing temperatures require longer annealing times. In one example, the thermal annealing step is carried out in an inert atmosphere (e.g., $N_2$, Ar, etc.). In one example, the pressure during the annealing step is about 0.1 Torr to about 760 Torr. The annealing process can be done in a furnace or a Rapid Thermal Anneal (RTA) chamber. In accordance with one embodiment, high temperatures can be employed because the annealing process occurs prior to formation of a photodiode in the semiconductor substrate 100.

In one example, the annealing step to drive boron from the conformal layer of B-doped oxide 108 into the silicon semiconductor substrate 100 can also electrically activate the second material 110 to enable a biasing function when the second material 110 is doped polysilicon. In one example, a thermal annealing step can accomplish two things, the first is to drive boron dopants into the silicon semiconductor substrate 100 to form the boron doped silicon region 112 as a passivation layer on the sides and bottom of the front-side deep trench isolation structure 114, and the second is to activate doped polysilicon fill in (the second material 110) electrically.

However, the process flow sequence is not limited to performing the annealing step after the deposition of both the conformal layer of B-doped oxide 108 and second material 110. In one example, instead of depositing the second material 110 after depositing the conformal layer of B-doped oxide 108, a first annealing process is performed. The first annealing process drives the boron from the conformal layer of B-doped oxide 108 into the silicon semiconductor substrate 100 to form a boron doped silicon region 112 as a passivation layer surrounding the sides and bottom of the trench 106 of the front-side deep trench isolation structure 114 on the sides and bottom as still illustrated in FIG. 5, but without the second material 110 inside the trench 106.

Figure 4:
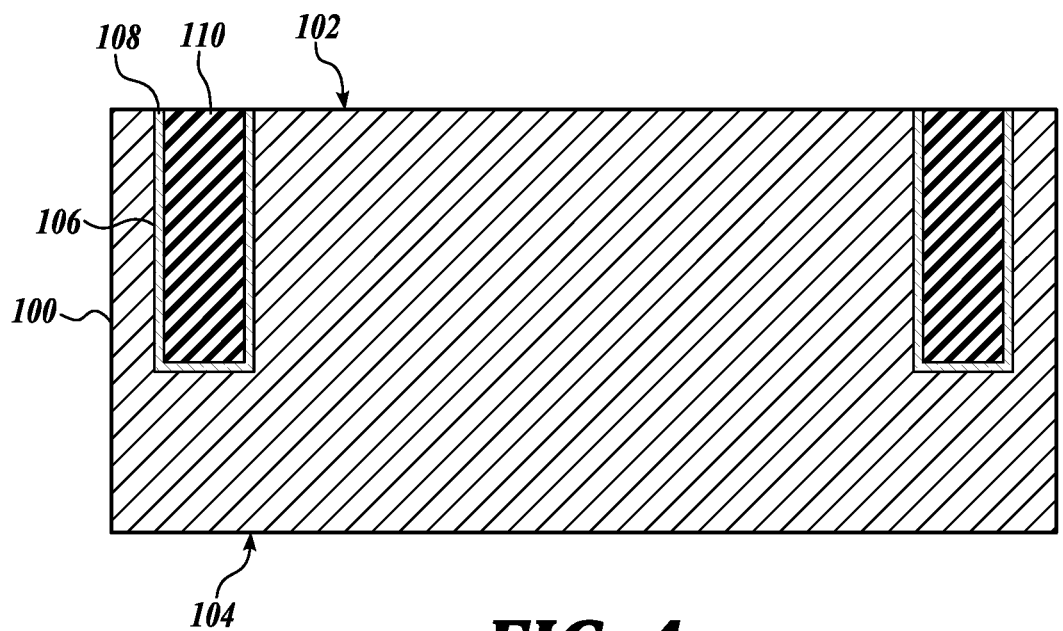

Further, prior to or after the first annealing process, a first chemical mechanical polishing step can also precede the deposition of the second material 110 to reduce the excess of the conformal layer of B-doped oxide 108 on top of the trench 106. The first chemical mechanical polishing stops on the first side 102 of the semiconductor substrate 100 as illustrated in FIG. 4 but without the second material 110 inside of the trench 106. However, chemical mechanical polishing of the conformal layer of B-doped oxide 108 can also be delayed until after the deposition of the second material 110.

After the first annealing process, the process flow sequence may continue with the deposition of the second material 110 as described above. After the deposition of the second material 110, a first or second chemical mechanical polishing may be performed to remove the excess second material 110 with or without the conformal layer of B-doped oxide 108 depending on whether the excess conformal layer of B-doped oxide 108 on the front surface of the semiconductor substrate 100 had already been removed or not.

After the deposition of the second material 110, and if the second material 110 is a doped polysilicon, a second annealing process can be performed to electrically activate the doped polysilicon to enable the biasing function.

Other variations of the process flow sequence with fewer or additional steps or in a different order are also within the scope of the disclosure when such variations result in a similar passivated deep trench isolation structure 114 or the structure 114 having a similar functionality.

After the completion of the passivated front-side deep trench isolation structure 114 of FIG. 5, wherein the boron doped silicon region 112 of the semiconductor substrate 100 on the bottom and sides of the trench 106 acts as a passivation layer, the conformal layer of B-doped oxide 108 having negative fixed charges may form an additional hole accumulation layer to provide additional passivation to the interface between the front-side deep trench isolation structure 114 and the semiconductor substrate 100. The hole accumulation layer may surround the trench of the front-side deep trench isolation structure 114 and passivate the defects/trap sites on the interface between front-side deep trench isolation structure 114 and the semiconductor substrate 100 resulting from the etching process to further reduce dark current. In one embodiment, the hole accumulation layer formed from the conformal layer of B-doped oxide 108 may be overlapped with the region of boron diffused from conformal layer of B-doped oxide 108. Thereafter, the process flow can employ conventional processes to build the remaining structure to complete the pixel structure.

Figure 6:
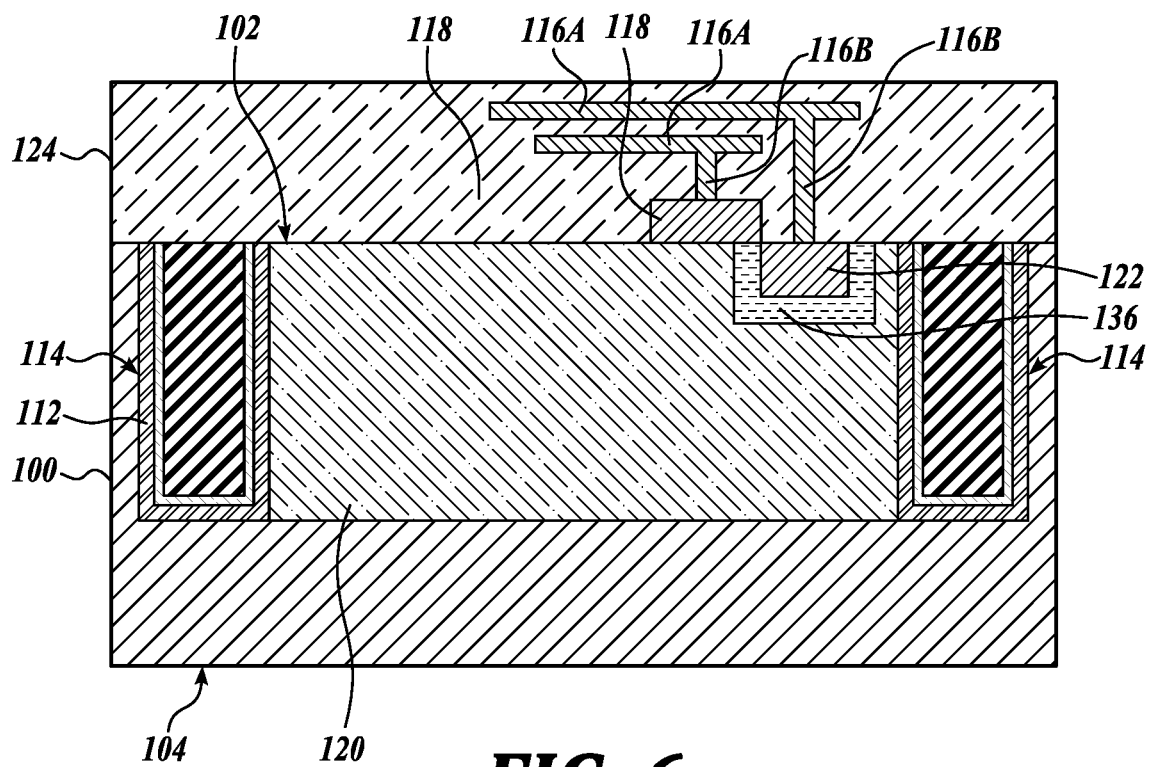

In the example depicted in FIG. 6, a photodiode region 120, pinning layer, a floating diffusion region 122, implant isolation well 136 (e.g., P-type isolation implant region), and source/drains are formed for pixel transistors by masking and ion implantation processes on the first side 102 of the semiconductor substrate 100. In accordance with an embodiment, because of high temperatures used in annealing, the photodiode region 120 is formed proximate the first side 102 of the semiconductor substrate 100 proximate to the front-side deep trench isolation structure 114 after the annealing of the conformal layer of B-doped oxide 108. The floating diffusion region 122 may be formed in the implant isolation well 136 having concentration and junction depth configured such that the photodiode region 120 is not directly connected to the floating diffusion region 122. Gate electrodes for pixel transistors, such as transfer gate, source follower transistor, reset transistor and row select may be formed subsequently. An interlayer dielectric layer 124 is formed on the surface of the first side 102 of the semiconductor substrate 100 to encapsulate the gate electrodes, contacts for source and drain of pixel transistors, such as drain of source follower transistor, drain of reset transistor and metal interconnection structure for pixel circuitry. In one embodiment, a contact for biasing the front-side deep trench isolation structure 114 having second material 110 as doped polysilicon may also be embedded in interlayer dielectric layer 124. Interlayer dielectric layer 124 further includes transfer gates 118 and gate electrodes for pixel transistors. In addition, metal interconnection structures may be formed in single or multiple metal layers and include metal conductors 116A and vias 116B. In embodiments, floating diffusion region is connected to the gate (e.g., source follower gate 944G) of source follower transistor and drain of reset transistor through the metal interconnection structures. Metal interconnection structures are also formed in the interlayer dielectric layer 124. The foregoing structures are fabricated in the typical order.

Figure 7:
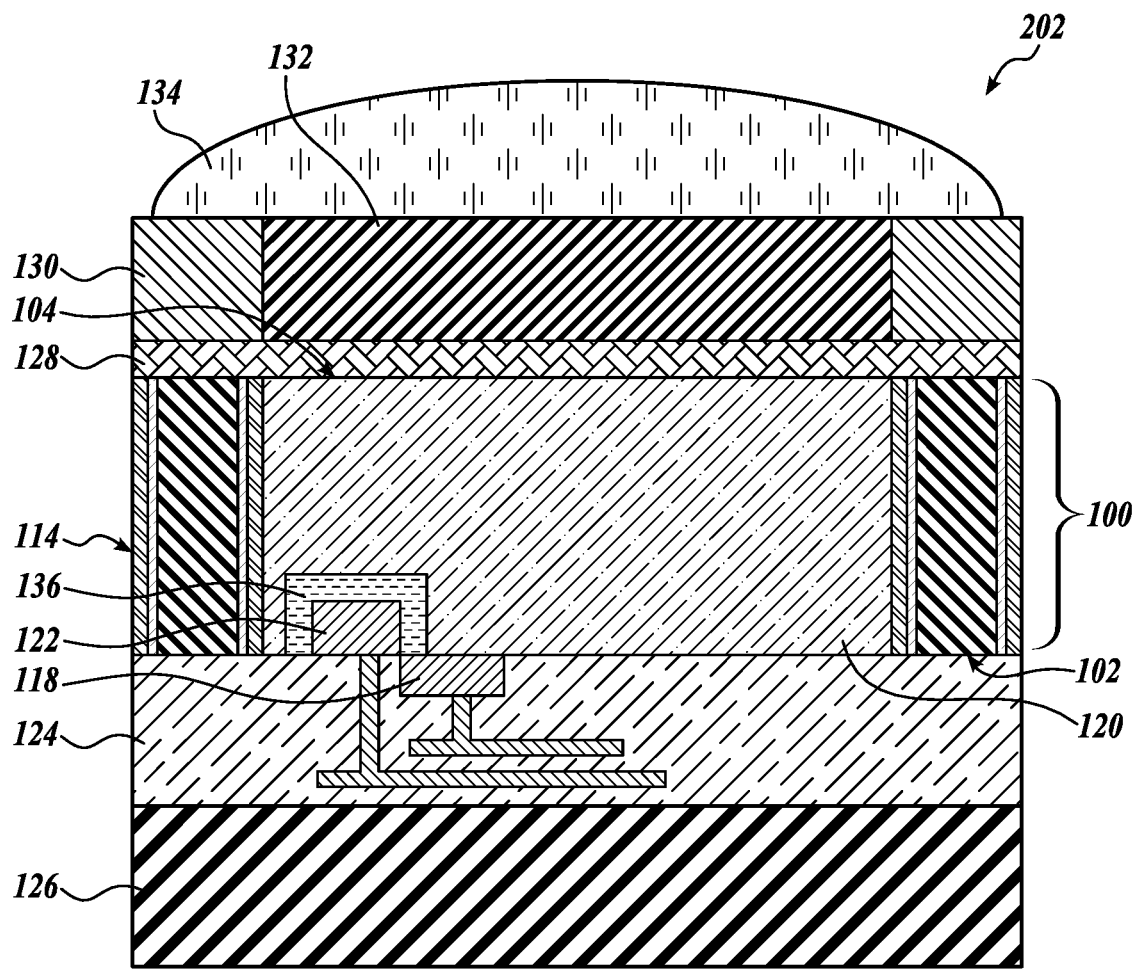

In the example depicted in FIG. 7, an example of a completed back-side illuminated pixel 202 is illustrated. From the structure of FIG. 6, the semiconductor substrate 100 has been flipped over to the first side 102 on top, and the interlayer dielectric layer 124 is bonded to an application-specific integrated circuit (ASIC) wafer 126, for example by a hybrid bonding or oxide bonding process.

The second side 104 illustrated in FIG. 7 has been thinned to the level of the doped polysilicon, second material 110. Semiconductor substrate 100 thinning includes grinding to remove the bulk of silicon material quickly. Bulk grinding is time controlled. After bulk grinding, a wet chemical etch is applied to remove silicon material in a much slower and better controlled manner. Wet chemical etching is also time controlled. Then, chemical mechanical polishing is applied to remove silicon defects, planarize the silicon surface, and define the final thickness. Chemical mechanical polishing can also time controlled.

The second side 104 or back-side processes are performed to form a buffer oxide layer 128 on the thinned second side 104 of the semiconductor substrate 100. A metal grid 130 is formed on the buffer oxide layer 128, and the metal grid 130 includes a plurality of metal structures. An array of color filters 132 is formed on the buffer oxide layer 128 and each color filter 132 is formed between the openings in the metal grid 130 and isolated by the corresponding metal structures. An array of microlenses 134 is formed on the array of color filters 132. Each microlens 134 is formed on the respective color filter 132 to direct incoming light through the respective color filters 132 to the respective photodiode region 120. The microlens 134 may be aligned to the center line of the adjacent metal structure of the metal grid 130. These structures are fabricated in the typical order.

In an exemplary operation, photodiode region 120 photogenerates and accumulates charges in the photodiode region 120 in response to incident light received through a second side 104 during an integration operation of a image sensor, wherein the incident light is directed to the photodiode region 120 by respective microlens 134 and filtered by respective color filter 132. The photogenerated charges are transferred to the floating diffusion region 122 through the conduction channel formed by the respective transfer transistor when the transfer gate 118 of the transfer transistor receives a supply voltage (e.g., positive bias voltage) turning on the associated transfer transistor during a charge transfer operation of the image sensor. Floating diffusion region 122 modulates the gate voltage of source follower transistor based on the amount of photogenerated charges received from to corresponding photodiode region 120 to have the source follower transistor output an image signal based on the gate voltage.

Figure 8:
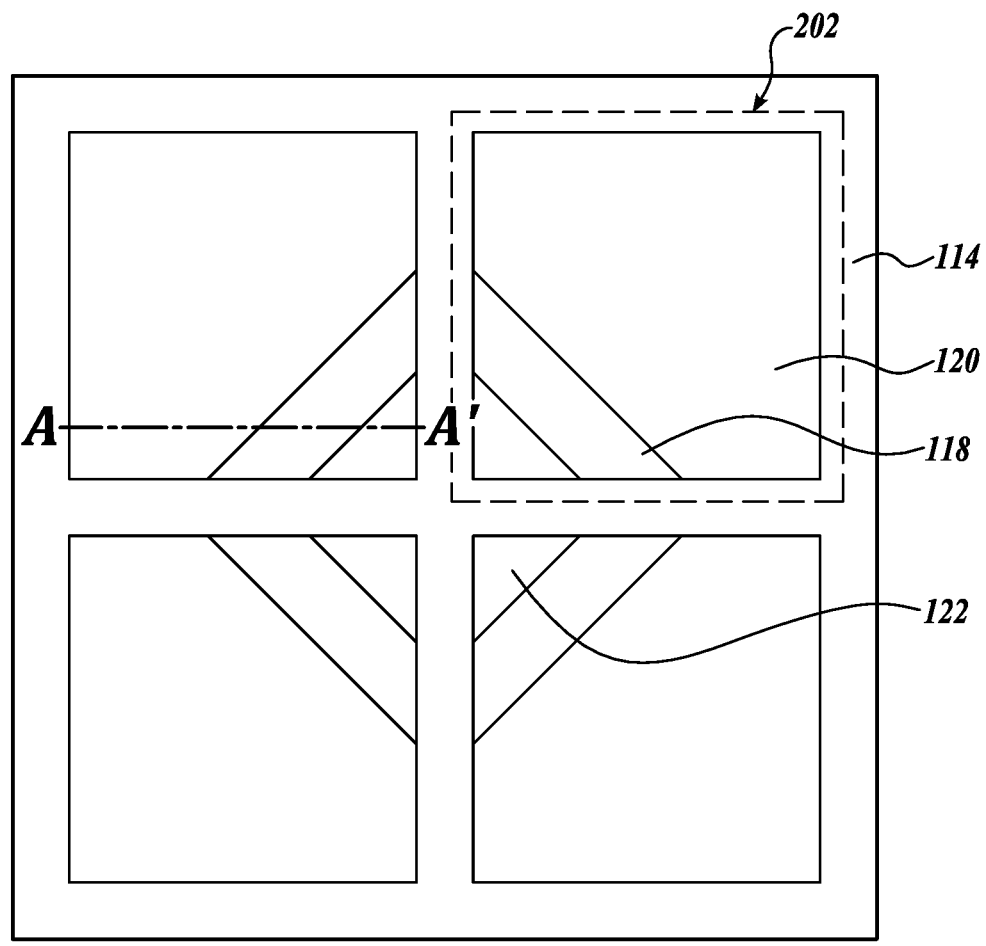
FIG. 8 is a plan view of one example of pixel cells with passivated full front-side deep trench isolation structures arranged in a pixel array in a semiconductor material layer in accordance with the teachings of the present invention.

The example illustrated in FIG. 8 depicts a plan view illustration of an example of a pixel 202 including photodiode regions 120, floating diffusion region 122, and transfer gates 118 of transfer transistor disposed proximate to a passivated, full, front-side deep trench isolation structure 114 fabricated according to this disclosure to prevent electrical cross talk. FIG. 7 may represent a cross-section along cut line A-A' of FIG. 8. In the example shown, the passivated full front-side deep trench isolation structure 114 includes a grid structure formed of a plurality of the deep trench structures which was formed by initially etching a plurality of trenches in a first direction that intersect with a plurality of trenches in a second direction on the first side 102 of semiconductor substrate 100 defining a plurality of photodiode regions for a plurality of pixels 202. As such in the completed process, each photodiode region 120 of pixel 202 is enclosed within a four-sided passivated full front-side deep trench isolation structure 114 such that photodiode region 120 of associated pixel 202 is electrically isolated from adjacent photodiode regions 120 in all directions. In other words, each pixel 202 is surrounded or enclosed by a grid structure formed from the passivated full front-side deep trench isolation structure 114 and isolated from photodiode region 120 of adjacent pixels 202 such that each individual pixel 202 is electrically isolated from any of the adjacent pixels 202. Restated, the pixel region (e.g., area of photodiode region 120) of each individual pixel 202 may be defined by the plurality of intersecting full front-side deep trench structures of the passivated full front-side deep trench isolation structure 114.

In one embodiment, pixel 202 may have at least a pixel transistor e.g., reset transistor, source follower transistor (or amplification transistor), a row select transistor may be formed above the corresponding photodiode region 120 to fully utilize the area within each pixel 202 for further pixel minimization without affecting light sensing of photodiode region 120. By further minimizing pixel area, higher spatial resolution may be achieved for the image sensor. One or more pixel transistors associated with pixel 202 may be disposed proximate to a trench of the passivated full front-side deep trench isolation structure 114 with sufficient spacing between the individual trench of the passivated full front-side deep trench isolation structure 114 and the pixel transistor. Those skilled in the art should appreciated that sufficient spacing may be determined based on the minimum separation needed for device fabrication.

Figure 9A:
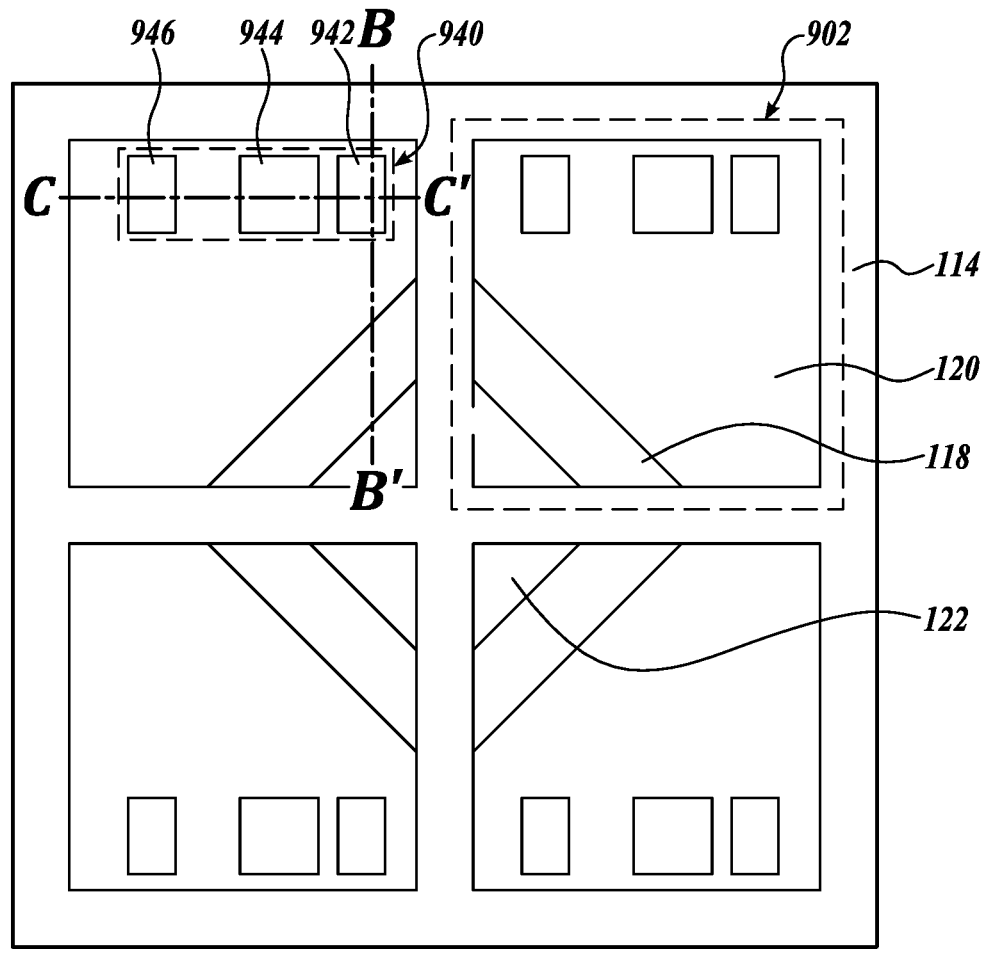
FIG. 9A is a plan view of one example of pixel cells with passivated full front-side deep trench isolation structures arranged in a pixel array in a semiconductor material layer in accordance with the teachings of the present invention.
Figure 9B:
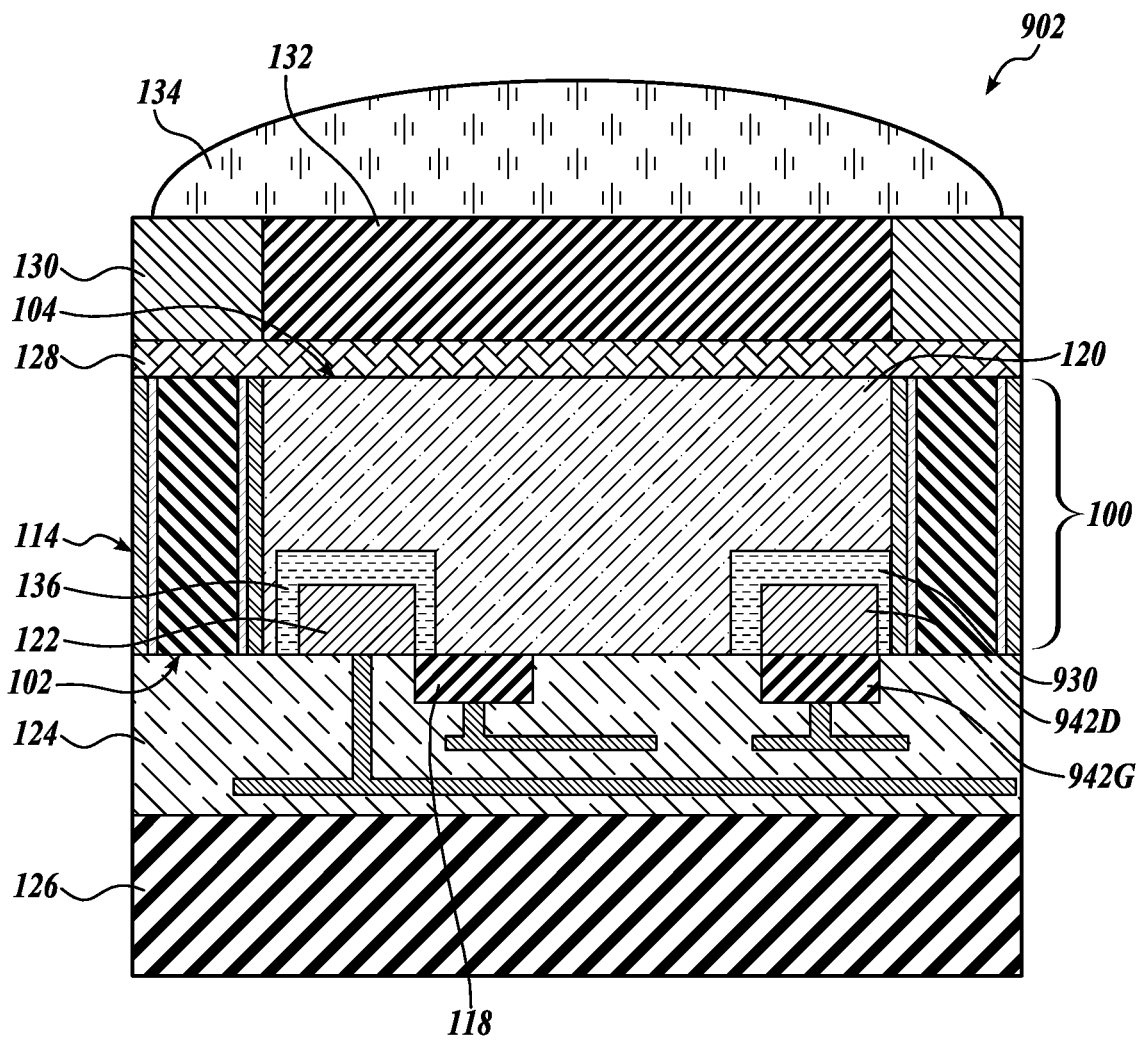
FIG. 9B-9C are cross-sectional illustrations of a semiconductor structure that show an example pixel structure for a CMOS image sensor in accordance with the teachings of the present invention.
Figure 9C:
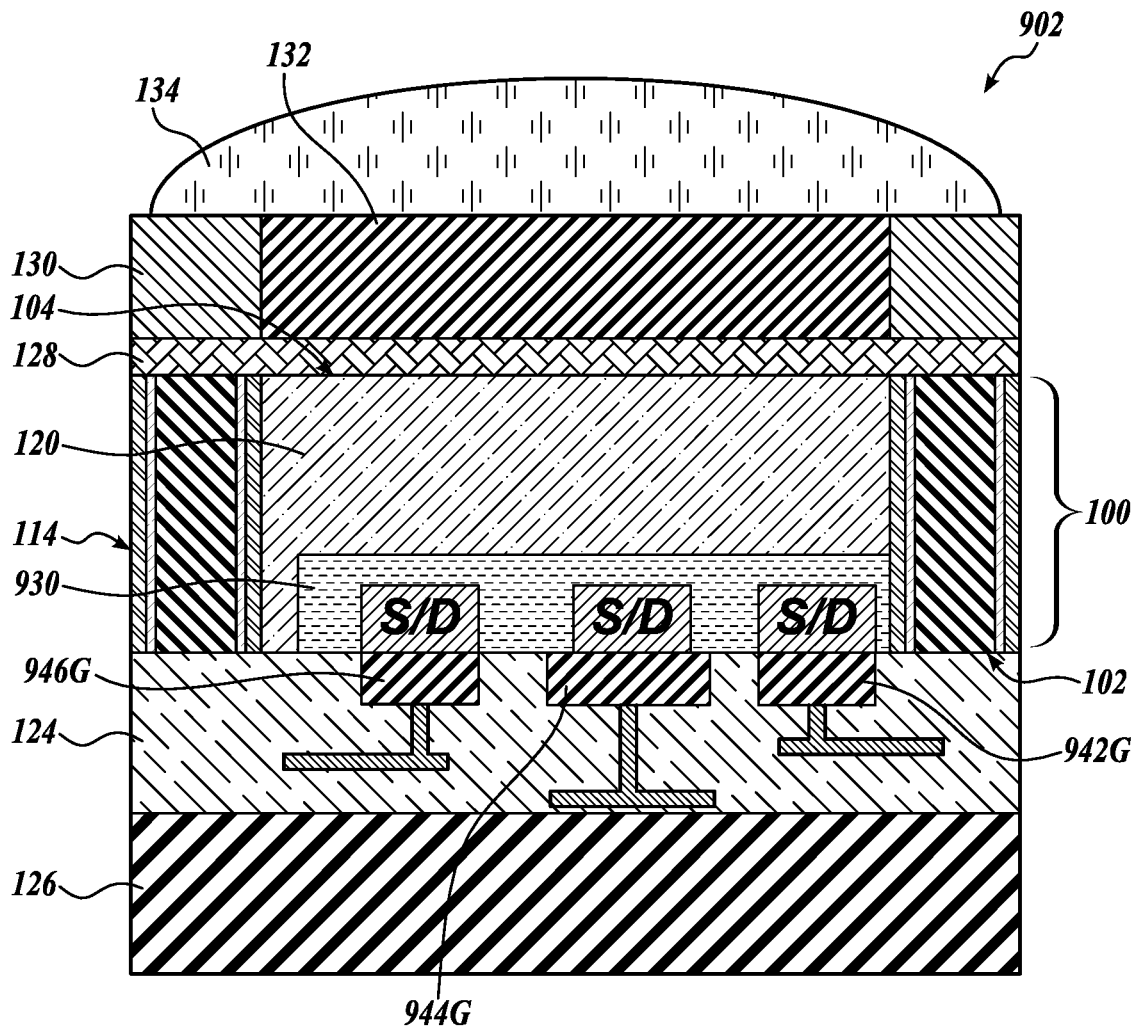

FIG. 9A is a plan view of one example of pixel cells 902 with passivated full front-side deep trench isolation structure 114 arranged in a pixel array in a semiconductor material layer in accordance with the teachings of the present invention. FIG. 9B is a cross-sectional illustrations of a semiconductor structure along cut line B-B' of FIG. 9A that shows an example pixel 902 structure for a CMOS image sensor in accordance with the teachings of the present invention. FIG. 9C is a cross-sectional illustrations of a semiconductor structure along cut line C-C' of FIG. 9A that shows an example pixel 902 structure for a CMOS image sensor in accordance with the teachings of the present invention.

For example, as illustrated in FIG. 9A, a pixel transistor region 940 for a pixel 902 may be defined above a photodiode region 120 within a pixel 202 with at least one of the pixel transistors 942, 944, 946 being formed above the photodiode region 120 with respect to the front-side 102. The region or area of pixel 202 is defined by the grid structure formed from a plurality passivated full front-side deep trenches of the passivated full front-side deep trench isolation structure 114. Specifically, the pixel transistor region 940 of pixel 202 may be electrically isolated from the corresponding photodiode region 120 by an implant isolation well 930 as illustrated in FIGS. 9B-9C. The implant isolation well 930 may be formed, for example, by an ion implantation on a surface of first side 102. In one example, the implant isolation well 930 may be formed at the same time as the formation of the implant isolation well 136, such as during the formation of the example substrate depicted in FIG. 6. In other words, pixel transistors 942, 944, 946 formed above the photodiode region 120 are electrically isolated from the photodiode region 120 by the implant isolation well 930.

In one example, as illustrated in FIG. 9C, a reset gate 942G of a reset transistor 942 is formed on a surface of the front-side 102 with source and drain (S/D) (e.g., 942D) formed in the implant isolation well 930 above the photodiode region 120 with respect to the front-side 102, wherein the source and drain for the reset transistor 942 may be formed along the direction into or out of page above the photodiode region 120. A source follower gate 944G of a source follower transistor 944 is formed on the surface of the front-side 102 with source and drain formed in the implant isolation well 930 above the photodiode region 120 with respect to the front-side 102, wherein the source and drain for the source follower transistor 944 may be formed along the direction into or out of page above the photodiode region 120. The source follower gate 944G of a source follower transistor 944 is connected to the contact (not illustrated) of floating diffusion region 122. A row select gate 946G of a row select transistor 946 is formed on the surface the front-side 102 with source and drain formed in the implant isolation well 930 above the photodiode region 120 with respect to the front-side 102, wherein the source and drain for the row select transistor 946 may be formed along the direction into or out of page above the photodiode region 120.

In the illustrated embodiment, the pixel 202 is a four-transistor configuration with pixel transistor region 940 including a reset transistor 942, a source follower transistor 944, and a row select transistor 946. However, it should be appreciated, depending on the pixel circuitry configuration, the pixel 202 may be configured to be three-transistor, five-transistor or six-transistor configuration, for example further includes dual floating diffusion (DFD) transistor, overflow transistor, and/or storage transistor, and the pixel transistor region 940 may include three, four, five or six transistors with corresponding spacing formed between pixel transistors without departing from the teaching of the present invention.

It should be appreciated that some features regarding gate structure such as spacers, gate oxide reading have been omitted in FIGS. 6, 7, 9B, and 9C for simplicity, as well as not to obscure an understanding of the embodiments. For example, there is a layer of gate oxide underneath gate electrodes, e.g., between the transfer gate 118, reset gate 942G, source follower gate 944G, row select gate 946G, and the front-side 102 surface. For example, there are single or multi-layer of oxide and/or nitride-based spacers on the side of gate electrodes providing implant alignment during self-aligned ion implantation process for forming association source/drain, e.g., the edge of a spacer for transfer gate 118 may be aligned with the edge of floating diffusion region 122 in FIG. 6.

Figure 10:
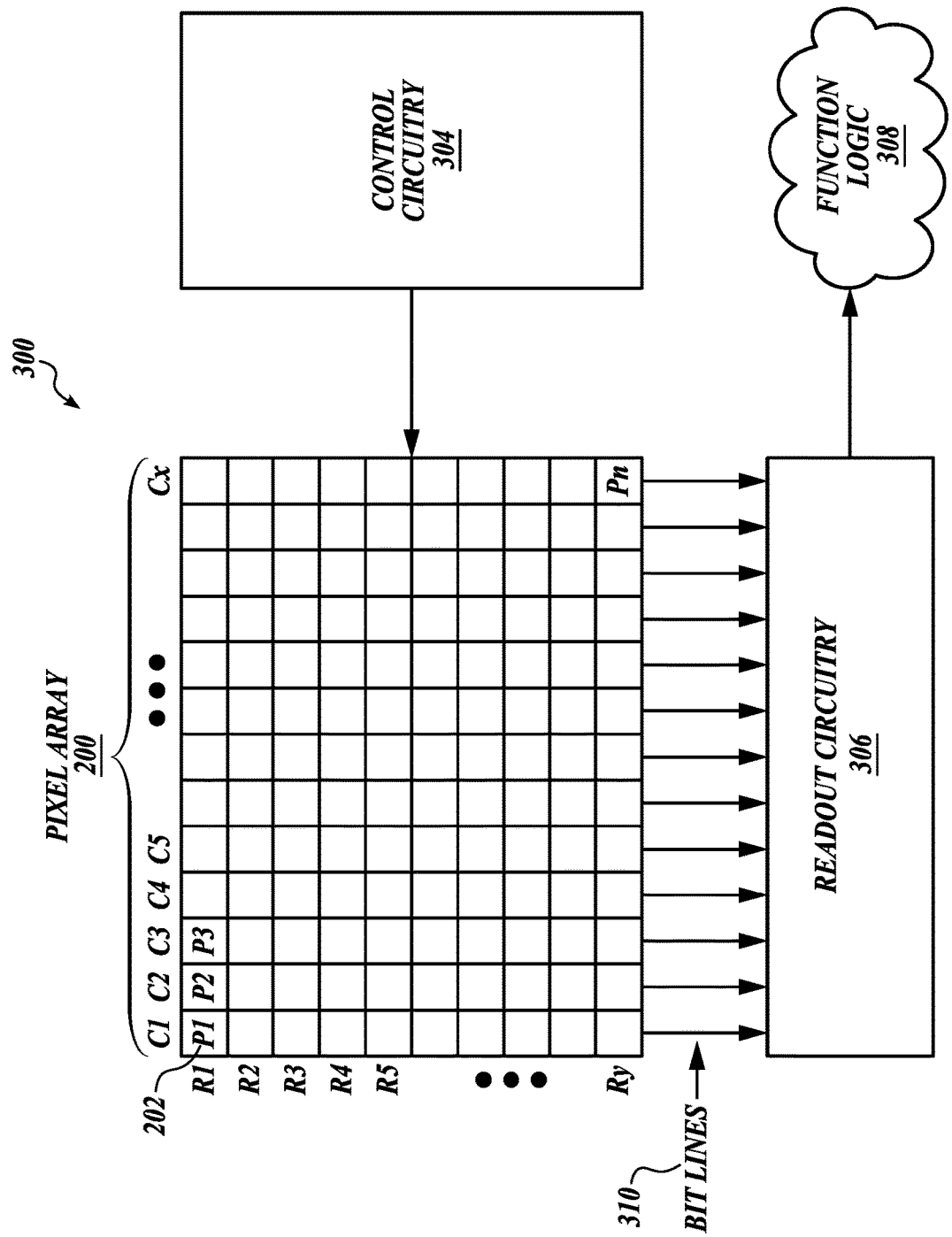
FIG. 10 is a block diagram illustrating an example of an imaging system using a pixel array with passivated full front-side deep trench isolation structures in accordance with the teachings of the present invention.

FIG. 10 is a block diagram illustrating one example of imaging system 300. Imaging system 300 includes a pixel array 200 (as in FIG. 8 or as in FIG. 9A), control circuitry 304, readout circuitry 306, and function logic 308. In one example, pixel array 200 is a two-dimensional (2D) array of photodiodes, or image sensor pixels 202 (e.g., pixels P1, P2 ..., Pn). Each of the image sensor photodiode/pixel 202 is electrically and/or optically isolated from adjacent image sensor photodiode/pixel 202 by a plurality of passivated full front-side deep trenches of a passivated full front-side deep trench isolation structure 114. As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, in other examples, it is appreciated that the photodiodes do not have to be arranged into rows and columns and may take other configurations.

In one example, after the image sensor photodiode/pixel 202 in pixel array 200 has acquired its image data or image charge, the image data is readout by readout circuitry 306 through bit lines 310 and then transferred to function logic 308. In various examples, readout circuitry 306 may include amplification circuitry, analog-to-digital (ADC) conversion circuitry, or otherwise. Function logic 308 may simply store the image data or even manipulate the image data by applying post image effects (e.g., crop, rotate, remove red eye, adjust brightness, adjust contrast, or otherwise). In embodiment, function logic 308 may be implemented by an image sensor processor (ISP) that is formed in the application-specific integrated circuit (ASIC) wafer 126. In one example, readout circuitry 306 may read out a row of image data at a time along readout column lines (illustrated) or may readout the image data using a variety of other techniques (not illustrated), such as a serial readout or a full parallel readout of all pixels simultaneously.

In one example, control circuitry 304 is coupled to pixel array 200 to control operation of the plurality of photodiodes in pixel array 200. For example, control circuitry 304 may generate a shutter signal for controlling image acquisition. In one example, the shutter signal is a global shutter signal for simultaneously enabling all pixels within pixel array 200 to simultaneously capture their respective image data during a single acquisition window. In another example, the shutter signal is a rolling shutter signal such that each row, column, or group of pixels is sequentially enabled during consecutive acquisition windows. In another example, image acquisition is synchronized with lighting effects, such as a flash.

In one example, imaging system 300 may be included in a digital camera, cell phone, laptop computer, automobile or the like. Additionally, imaging system 300 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 300, extract image data from imaging system 300, or manipulate image data supplied by imaging system 300.

The above description of illustrated examples of the present invention, including what is described in the Abstract, are not intended to be exhaustive or to be a limitation to the precise forms disclosed. While specific embodiments of, and examples for, the invention are described herein for illustrative purposes, various equivalent modifications are possible without departing from the broader spirit and scope of the present invention. Indeed, it is appreciated that any specific example voltages, currents, frequencies, power range values, times, temperatures etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A method for forming a deep trench isolation structure for a CMOS image sensor, comprising:
    forming a trench in a semiconductor substrate, wherein the trench extends from a first side of the semiconductor substrate toward a second side of the semiconductor substrate, wherein the trench has an opening on the first side and a bottom and sides of the trench are formed of the semiconductor substrate;
    depositing a conformal layer of boron (B)-doped dielectric at least on the bottom and sides of the trench, wherein the conformal layer of B-doped dielectric is less than half a width of the trench to leave a depthwise recess in the trench;
    depositing a second material at least on the conformal layer of B-doped dielectric in the trench, wherein the second material fills the recess in the trench to at least the first side; and annealing the conformal layer of B-doped dielectric to drive boron from the conformal layer of B-doped dielectric to the semiconductor substrate and form a B-doped region of the semiconductor substrate corresponding to a passivation layer disposed next to the conformal layer of B-doped dielectric, wherein the second material comprises doped polysilicon and the annealing of the conformal layer of B-doped dielectric further electrically activates the doped polysilicon.

2. The method of claim 1, wherein said depositing the conformal layer of B-doped dielectric includes atomic layer deposition or chemical vapor deposition at a deposition temperature between 300° C. and 500° C.

3. The method of claim 1, wherein said depositing the second material includes depositing the doped polysilicon by chemical vapor deposition at a deposition temperature between 450° C. to 550° C.

4. The method of claim 1, wherein the conformal layer of B-doped dielectric is a borosilicate glass.

5. The method of claim 1, wherein the conformal layer of B-doped dielectric is 10 nm to 30 nm thick.

6. The method of claim 1, wherein the deposited conformal layer of B-doped dielectric has a boron atomic concentration of 5% to 20% before the annealing.

7. The method of claim 1, wherein the second material is blanket deposited, and wherein the method further comprises chemical mechanical polishing the second material to the semiconductor substrate.

8. The method of claim 1, wherein the annealing of the conformal layer of B-doped dielectric is conducted from 800° C. to 1000° C. and for a time of 1 min to 60 min in an inert ambient atmosphere at a pressure of 0.1 Torr to 760 Torr.

9. The method of claim 1, wherein the annealing of the conformal layer of B-doped dielectric occurs prior to a formation of a photodiode in the semiconductor substrate.

10. The method of claim 1, further comprising:
forming a photodiode proximate the first side of the semiconductor substrate proximate to the deep trench isolation structure after the annealing of the conformal layer of B-doped dielectric;
thinning the second side of the semiconductor substrate to a level of the passivation layer at the bottom of the trench to form a full deep trench isolation structure extending from the first side to the second side of the semiconductor substrate; and
forming an isolation well proximate to the first side of the semiconductor substrate, wherein the isolation well defines a pixel transistor region disposed above the photodiode such that the isolation well is disposed between the first side of the semiconductor substrate and the photodiode.

11. The method of claim 10, further comprising:
forming an interlayer dielectric layer on the first side of the semiconductor substrate including metal conductors and vias disposed in the interlayer dielectric layer;
forming a buffer oxide layer on the second side of the semiconductor substrate;
forming a metal grid on the buffer oxide layer;
forming a color filter on the buffer oxide layer;
and forming a microlens on the color filter.

12. The method of claim 11, further comprising bonding the interlayer dielectric layer to an application-specific integrated circuit (ASIC) wafer.

13. The method of claim 10, further comprising forming, at least in part within the isolation well, a pixel transistor disposed proximate to the first side above the photodiode, the pixel transistor having a gate electrode formed on a surface of the first side.

14. The method of claim 1, wherein the conformal layer of B-doped dielectric has negative fixed charges from the annealing.

15. The method of claim 14, wherein the conformal layer of B-doped dielectric forms a hole accumulation layer to provide additional passivation due, at least in part, to the negative fixed charges.

16. The method of claim 15, wherein the hole accumulation layer formed of the conformal layer of B-doped dielectric overlaps with the B-doped region of the semiconductor substrate that forms the passivation layer.

17. The method of claim 1, wherein the conformal layer of B-doped dielectric directly contacts the second material and the passivation layer.

18. The method of claim 1, wherein the annealing occurs after the depositing the second material.

19. A method for forming a deep trench isolation structure for a CMOS image sensor, comprising:
forming a trench in a semiconductor substrate, wherein the trench extends from a first side of the semiconductor substrate toward a second side of the semiconductor substrate, wherein the trench has an opening on the first side and a bottom and sides of the trench are formed of the semiconductor substrate;
depositing a conformal layer of boron (B)-doped dielectric at least on the bottom and sides of the trench, wherein the conformal layer of B-doped dielectric is less than half a width of the trench to leave a depthwise recess in the trench;
depositing a second material at least on the conformal layer of B-doped dielectric in the trench, wherein the second material fills the recess in the trench to at least the first side; and
annealing the conformal layer of B-doped dielectric to drive boron from the conformal layer of B-doped dielectric to the semiconductor substrate and forms a B-doped region of the semiconductor substrate corresponding to a passivation layer disposed next to the conformal layer of B-doped dielectric, and the conformal layer of B-doped dielectric having negative fixed charges, wherein the second material comprises doped polysilicon and the annealing of the conformal layer of B-doped dielectric further electrically activates the doped polysilicon.

* * * * *